(12) United States Patent
Gambee et al.

(10) Patent No.: US 10,790,251 B2
(45) Date of Patent: Sep. 29, 2020

(54) METHODS FOR ENHANCING ADHESION OF THREE-DIMENSIONAL STRUCTURES TO SUBSTRATES

(71) Applicant: Micron Technology, Inc., Boise, ID (US)

(72) Inventors: Christopher J. Gambee, Caldwell, ID (US); Nhi Doan, Boise, ID (US); Chandra S. Tiwari, Boise, ID (US); Owen R. Fay, Meridian, ID (US); Ying Chen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/013,237

(22) Filed: Jun. 20, 2018

(65) Prior Publication Data

US 2019/0393176 A1  Dec. 26, 2019

(51) Int. Cl.
*H01L 23/00* (2006.01)
*H01L 21/027* (2006.01)
*H01L 21/56* (2006.01)

(52) U.S. Cl.
CPC .......... *H01L 24/12* (2013.01); *H01L 21/0274* (2013.01); *H01L 21/56* (2013.01); *H01L 24/11* (2013.01); *H01L 2224/0345* (2013.01); *H01L 2224/03912* (2013.01); *H01L 2224/05647* (2013.01); *H01L 2224/1191* (2013.01); *H01L 2224/11462* (2013.01)

(58) Field of Classification Search
CPC ...... H01L 21/0274; H01L 21/311; G03F 7/32; H05K 13/00
USPC .................................. 257/E23.021, E21.508
See application file for complete search history.

(56) References Cited

U.S. PATENT DOCUMENTS

| | | | |
|---|---|---|---|
| 8,659,153 B2 * | 2/2014 | Fay | H01L 24/11 257/737 |
| 9,269,646 B2 | 2/2016 | Luo et al. | |
| 2016/0004160 A1 * | 1/2016 | Tagawa | G03F 7/2022 430/296 |
| 2016/0357110 A1 * | 12/2016 | Zhou | G03F 7/002 |
| 2017/0069539 A1 * | 3/2017 | Li | H01L 21/823431 |

OTHER PUBLICATIONS

Hiro et al., Thicker Film Photodefinable Polyimides, Advanced Packaging, Oct. 2000, 4 pages.

* cited by examiner

*Primary Examiner* — Jonathan Han
(74) *Attorney, Agent, or Firm* — TraskBritt

(57) ABSTRACT

Methods of forming supports for 3D structures on semiconductor structures comprise forming the supports from photodefinable materials by deposition, selective exposure and curing. Semiconductor dice including 3D structures having associated supports, and semiconductor devices are also disclosed.

19 Claims, 10 Drawing Sheets

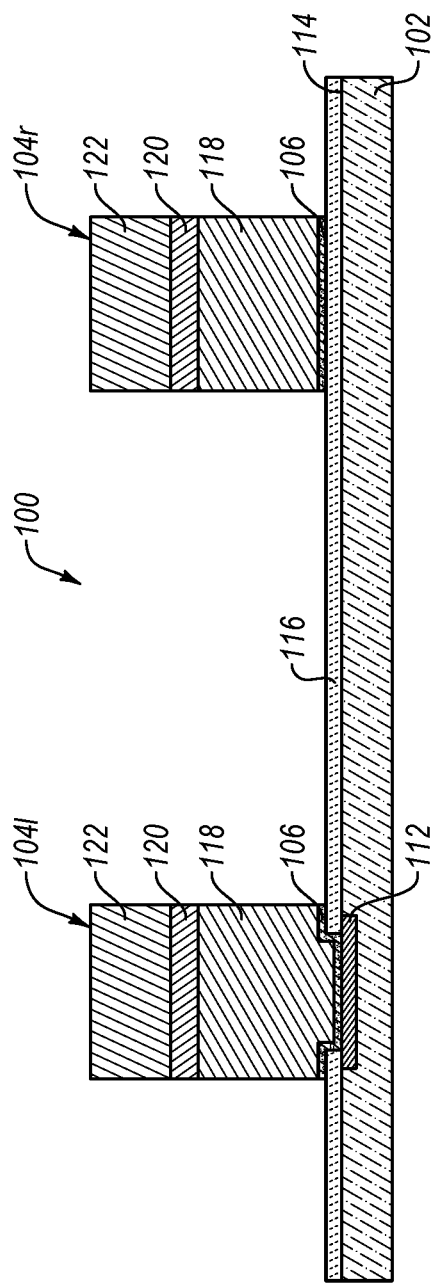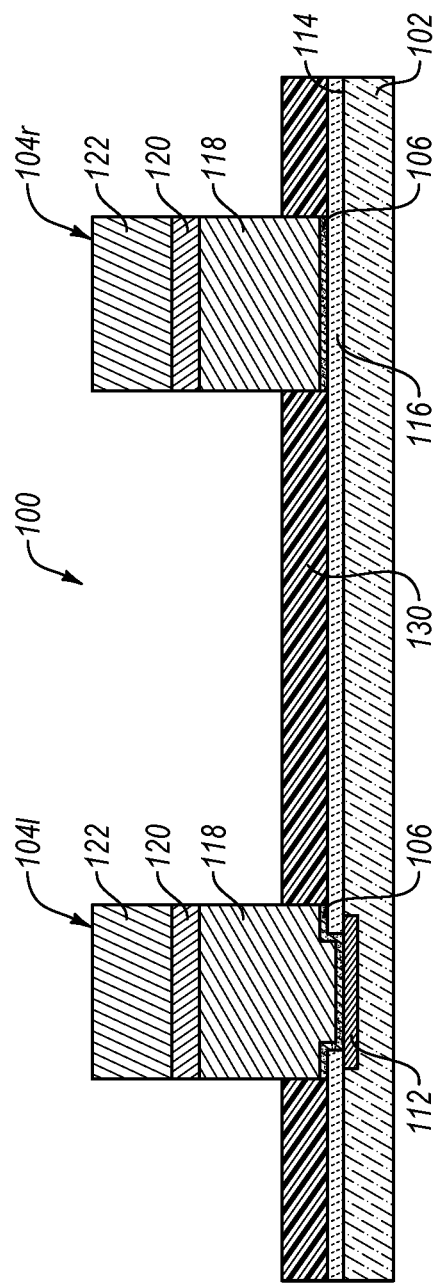

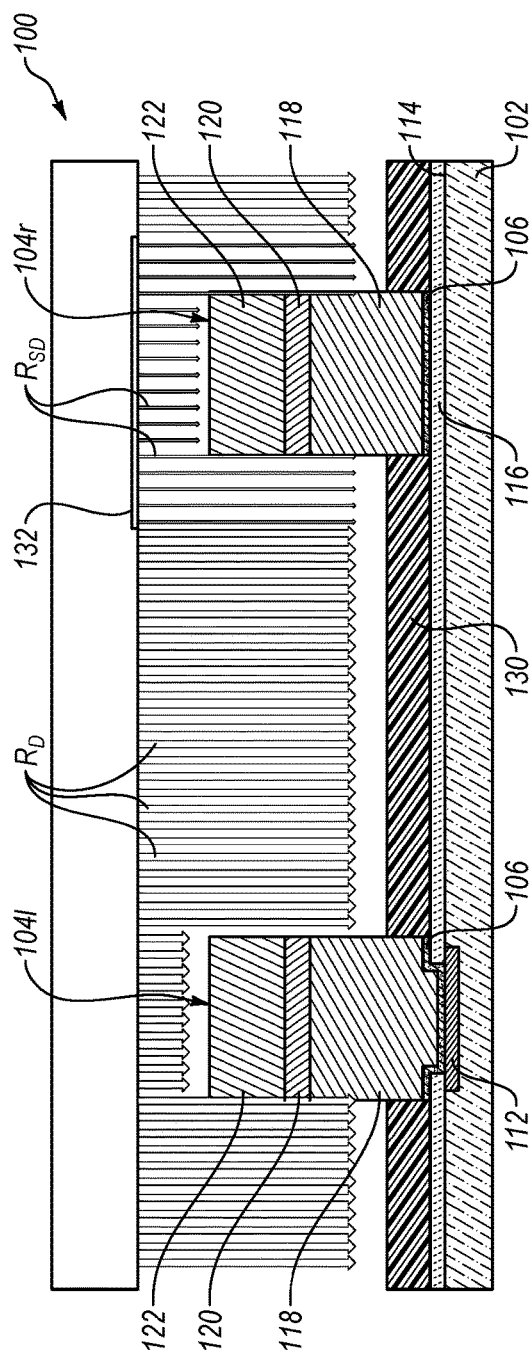
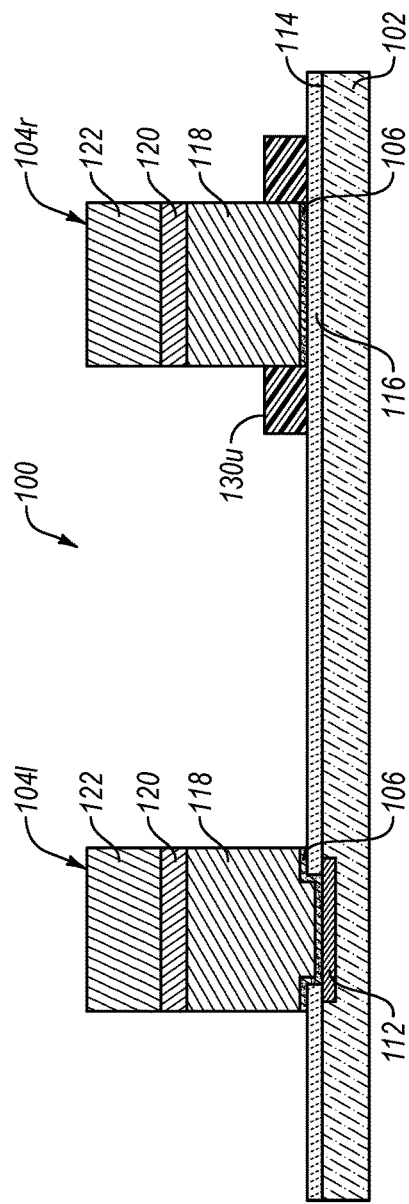
FIG. 3C
FIG. 3D

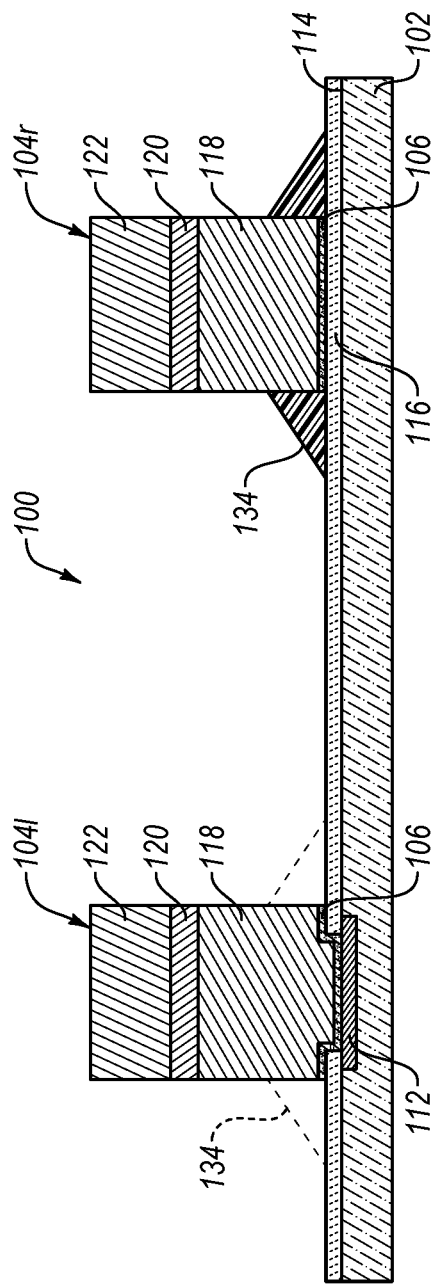
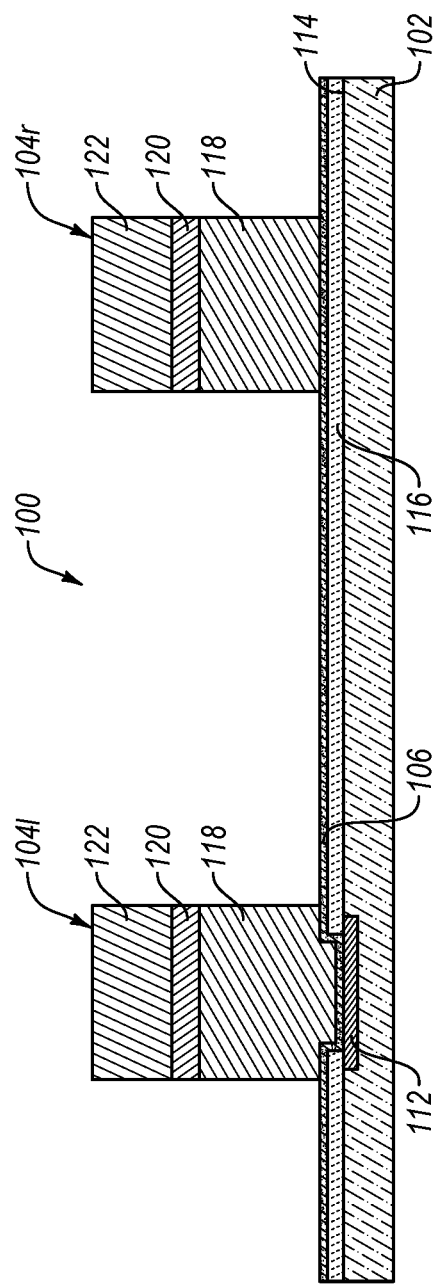

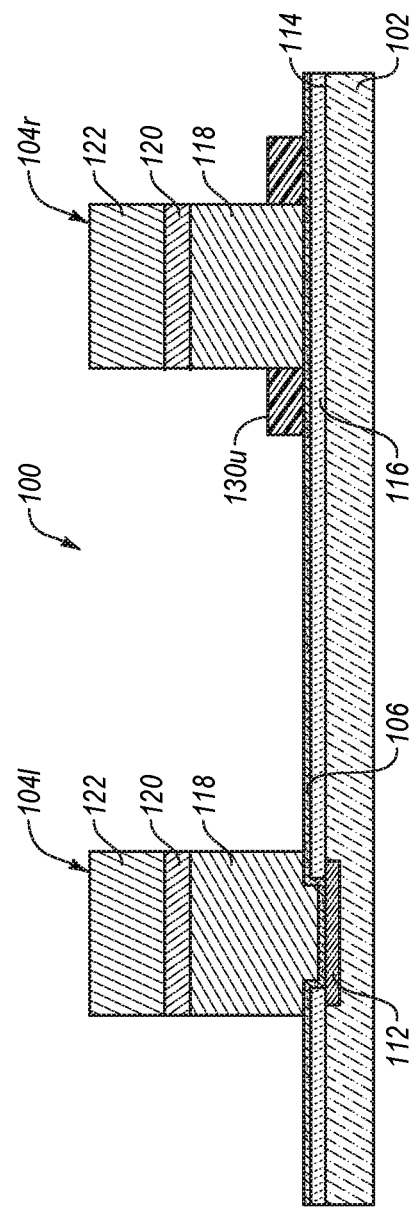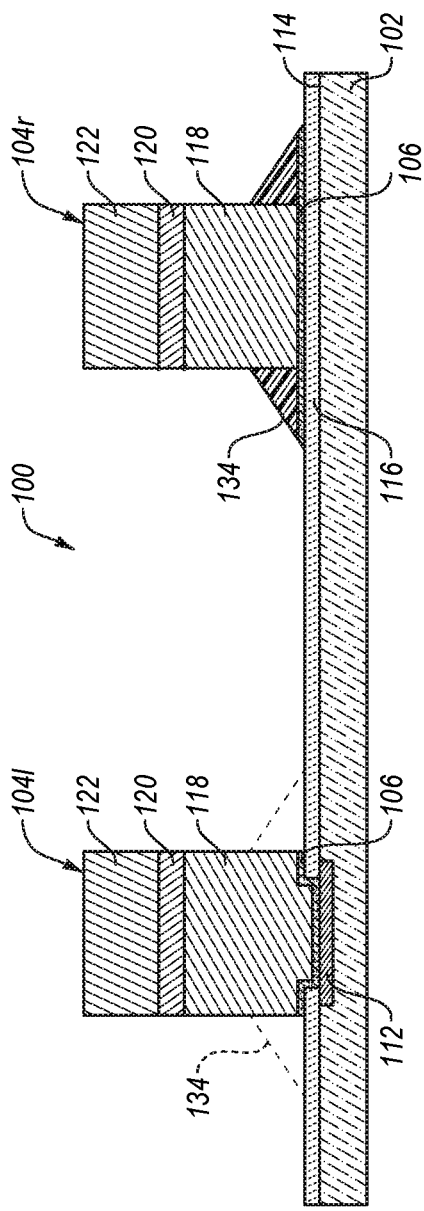

METHODS FOR ENHANCING ADHESION OF THREE-DIMENSIONAL STRUCTURES TO SUBSTRATES

FIELD

Embodiments of the present disclosure relate to methods of semiconductor device fabrication and, more particularly, for enhancing adhesion of three-dimensional (3D) structures to substrates of such semiconductor devices, and to related assemblies and systems.

BACKGROUND

Increased circuit density is an ongoing goal of manufacturers of semiconductor devices. One long-favored configuration is an assembly of vertically stacked semiconductor dice, at least some of which are interconnected electrically and the stacked die assembly being mechanically and electrically connected to higher level packaging, such as an interposer or other substrate bearing conductive traces.

One configuration employing a plurality of stacked semiconductor dice is a Micropillar Grid Array Package ("MPGA"). Such a package comprises a stack of a plurality (for example four (4)) of dynamic random-access memory (DRAM) semiconductor memory dice vertically interconnected from an uppermost die to a lowermost die, and a plurality of electrically conductive pillars extending from the underside of the lowermost memory die for connection to a logic die or a System on a Chip (SoC) die.

The provider of the logic die or the SoC die conventionally mounts their device to an interposer, such as a ball grid array (BGA) substrate, the logic or SoC die including conductive through vias for connection to the conductive pillars on the underside of the MPGA. The MPGA is mounted to the logic die or SoC die on the interposer and the assembly is then overmolded with an encapsulant into a finished Ball Grid Array (BGA) package.

The aforementioned configuration, implemented as a so-called "Wide I/O" memory device, enables fast memory access, and reduces power requirements.

One particularly promising configuration of an MPGA is a die assembly which incorporates a high-speed logic die below a vertical stack of DRAM dice interconnected with through-silicon vias (TSVs). The DRAM dice are configured specifically to only handle data, while the logic die provides all DRAM control within the die assembly. The design is expected to reduce latency, and greatly improve bandwidth and speed, while offering significantly reduced power demand and physical space requirements and providing flexibility for multiple platforms and application through use of different logic dice. One such implementation of a die assembly as described above may be characterized as a Memory Cube DRAM (MCDRAM) comprising a thermally conductive overmold over the DRAM dice and in contact with the logic die where it extends peripherally beyond the stack of DRAM dice. Another implementation of such a die assembly may be characterized as a Hybrid Memory Cube (HMC), wherein a lid is disposed over the stack of DRAM dice in peripheral contact with the logic die.

End products of the above designs will find a wide variety of applications including, among others, in mobile electronic devices such as so-called "smart phones," laptop and notebook computers, supercomputers, BLACKBERRY® devices, iPHONE® and iPAD® devices, and DROID® devices.

One significant concern with regard to implementation of the above-referenced designs is providing good adhesion, sufficient to withstand reliability stress testing, between bond pads and other surface portions of a semiconductor die and 3D structures in the form of small diameter pillars at tight pitches employed to provide reliable electrical connections to another semiconductor die, interposer or other substrate above or below the semiconductor die in a stack, to stabilize stacked semiconductor dice, or to provide heat transfer without electrical connectivity.

The methods disclosed in the aforementioned patent, however, are inapplicable to some structures formed on semiconductor dice and, specifically, those where 3D structures formed on or over a substrate of a semiconductor die are not metallurgically bonded to an underlying metal structure of the die, for example, a bond pad. In other instances, even metallurgically bonded 3D structures may not exhibit adequate shear strength for all applications.

In a 3D structure in the form of a conventional pillar on pad interconnect structure for a semiconductor die, copper material of a conductive element in the form of a pillar extends over an exposed surface of a bond pad and over passivation material surrounding and extending peripherally over a portion of bond pad, the pillar bonded to both the bond pad and passivation material. Structural support provided to conductive element by metallurgical bonding to the bond pad in combination with bonding to the passivation material peripheral to the area of contact with bond pad may be sufficient when connectivity is established during heat-induced bonding comprising mass reflow of solder material capping pillars to attach and electrically connect the semiconductor die to another component, such as another die, an interposer or higher level packaging. Similarly, if a solder material is not employed, the pillars may be diffusion bonded to a terminal pad of another component by thermocompression bonding. For certain applications, however, it may be desirable to provide additional structural support to the pillar to enhance adhesion thereof, and specifically shear strength of the attachment of the pillar to the bond pad.

In addition, when fabricating 3D structures, for example, in the form of electrically inactive, so-called "dummy" pillars, studs, columns or other configurations formed as standoffs or outriggers to stabilize a semiconductor die having one or more central rows of bond pads when assembled with another component, no metallurgical bond is formed between the metal material of the 3D structure and an underlying passivation material. Similar issues arise with response to 3D structures to enhance heat transfer between a semiconductor die and another component in electrical isolation from the other component, As a result, shear strength of the adhesion of the 3D structure may be compromised to an unacceptable degree for handling and assembly with other components.

BRIEF DESCRIPTION OF THE DRAWINGS

FIGS. 3A through 3E are schematic side sectional elevations of a method for fabricating a support elements for a 3D structure according to an embodiment of the disclosure;

FIGS. 4A through 4E are schematic side sectional elevations of a method for fabricating a support element for a 3D structure according to an embodiment of the disclosure;

Figure 1:
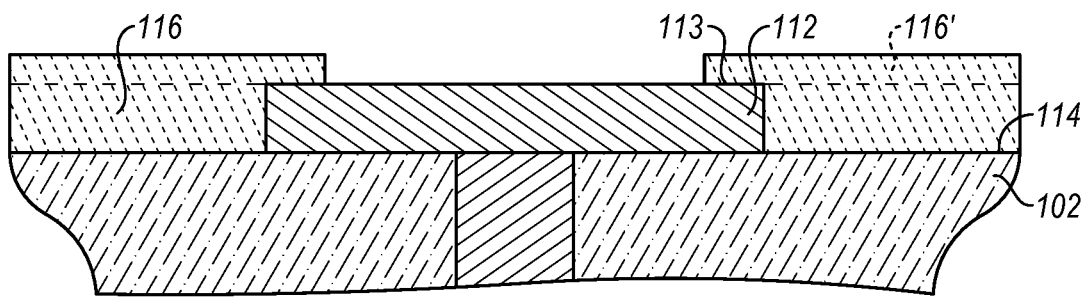
FIGS. 1 and 2 are schematic side sectional elevations of a portion of a method for fabricating 3D structures in the form of pillars, such structures being susceptible to further processing according to embodiments of the disclosure.

DETAILED DESCRIPTION 3D structures for semiconductor die assemblies are disclosed, as are semiconductor die assemblies including such 3D structures, and methods of enhancing adhesion of such 3D structures to, for example, the substrate of a semiconductor die. As used herein, the term "3D structure" means and includes three-dimensional elements formed on or over a substrate of a semiconductor die and projecting from the substrate in a direction transverse thereto. Stated another way, 3D structures exhibit a length and width (which may be the same) parallel to a major plane of a substrate, and a height transverse to the major plane.

It has been recognized by the inventors herein as a desirable characteristic of semiconductor device fabrication and packaging to provide enhanced adhesion of 3D structures to a semiconductor substrate without adding to the height of the 3D structures and, therefore, to package height, without changing bond line thickness, and without introducing new materials to those already used with a given package design. In addition, it is highly desirable that electrical characteristics of a semiconductor die with 3D structures not be altered when adhesion is enhanced, or that 3D structures in a design not require a redesign.

Embodiments of the disclosure may increase shear strength of 3D structures against dislodgment from underlying substrate surfaces, enhancing robustness of the manufacturing process at the packaging process level rather than through upstream process changes or design changes.

As used herein, the term "wafer" means and includes a volume of a semiconductor material in the form of a bulk semiconductor substrate, and is not limited to conventional, substantially circular wafers. As used herein, the term "semiconductor material" means and includes silicon, germanium, gallium arsenide, indium phosphide, and other III-V or II-VI type semiconductor materials. As used herein, the terms "semiconductor substrate," "semiconductor die" and "die" and plural forms thereof, mean and include a segment or segments of semiconductor material bearing integrated circuitry and singulated from a bulk semiconductor substrate. As used herein, the term "memory die" and plural forms thereof means and includes all forms of integrated circuit memory, including, by way of non-limiting example including DRAM, SRAM, Flash memory, and other memory forms.

As used herein, the term "major surface" means and includes one of an active surface and a back side of a wafer, a semiconductor substrate or a semiconductor die. As used herein, the term "major plane" means and includes a plane parallel to an active surface and a back side of a wafer, a portion of a wafer or a semiconductor die.

As used herein, the term "photodefinable material" means and includes materials formulated to alter one or more material characteristics responsive to exposure to radiant energy. Such material characteristics include, but are not limited to, material chemistry and structural characteristics, and specifically include relative solubility or lack thereof in a selected solvent. Examples of photodefinable materials include commercially available positive tone and negative tone photoresists, as well as other materials in solution or suspension in carrier fluids as used to provide the aforementioned behavior in such photoresists. Specific, non-limiting examples of photoresists include positive and negative polyimide resists. Examples of solvents include developers employed in conjunction with photoresists after exposure to radiant energy.

As employed herein, the terms "about" and "substantially," as used in connection with a given parameter, each mean and include variances from the designated value referenced for that particular parameter within normal manufacturing tolerances, material variations, accuracy of measuring instrumentation, consistency of controls, etc., as the case may be and as recognized by those of ordinary skill in the art.

As used herein, the term "adhesion" with reference to 3D structures means and includes bonding and securement of a 3D structure to a surface of a substrate or other material over a substrate, both directly and in combination with an associated support element in contact with the 3D structure and substrate.

As used herein, the terms "collar" and "support" each mean and include a structure separate from and abutting a 3D structure for enhancing adhesion and support of the 3D structure, and is not limited to an annular structure or necessarily to a structure surrounding the 3D structure. For example, a collar may lie on one side of a 3D structure, extend about a portion of a diameter of a 3D structure or on some but not all sides of a rectangular or polygonal structure.

The following description provides specific details, such as material types and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device. Only those process acts and structures necessary to understand the embodiments of the present disclosure are described in detail below. Additional acts to form a complete semiconductor device from the semiconductor structures may be performed by conventional fabrication techniques.

In the following detailed description, reference is made to the accompanying drawings, which form a part hereof, and in which is shown, by way of illustration, specific embodiments in which the present disclosure may be practiced. These embodiments are described in sufficient detail to enable a person of ordinary skill in the art to implement embodiments of the present disclosure. However, other embodiments may be implemented, and structural, logical, and electrical changes encompassed by the disclosure may be made. The illustrations presented herein are not meant to be actual views of any particular semiconductor die or semiconductor device, but are merely idealized representations that are employed to more completely describe the embodiments of the present disclosure. The drawings presented herein are not necessarily drawn to scale. Additionally, elements common between drawings may retain the same or a similar numerical designation.

The following description of certain embodiments of method of the disclosure and related structures are characterized primarily, for clarity and by way of example only, with respect to two 3D structures formed on a semiconductor substrate, one such 3D structure comprising a pillar on pad (i.e., bond pad) structure on an active surface of a wafer and another such structure comprising a pillar formed on a passivation material on the active surface of the wafer. However, in practice the various embodiments may be performed for efficiency on a wafer scale, to form thousands of 3D structures of each of the foregoing types on hundreds of semiconductor dice residing on a wafer. Such wafer scale processing is well known to those of ordinary skill in the art and, so, will not be described in detail.

In the description below, like elements and features depicted in the drawings are described by the same, or similar, reference numerals for clarity.

Figure 2:
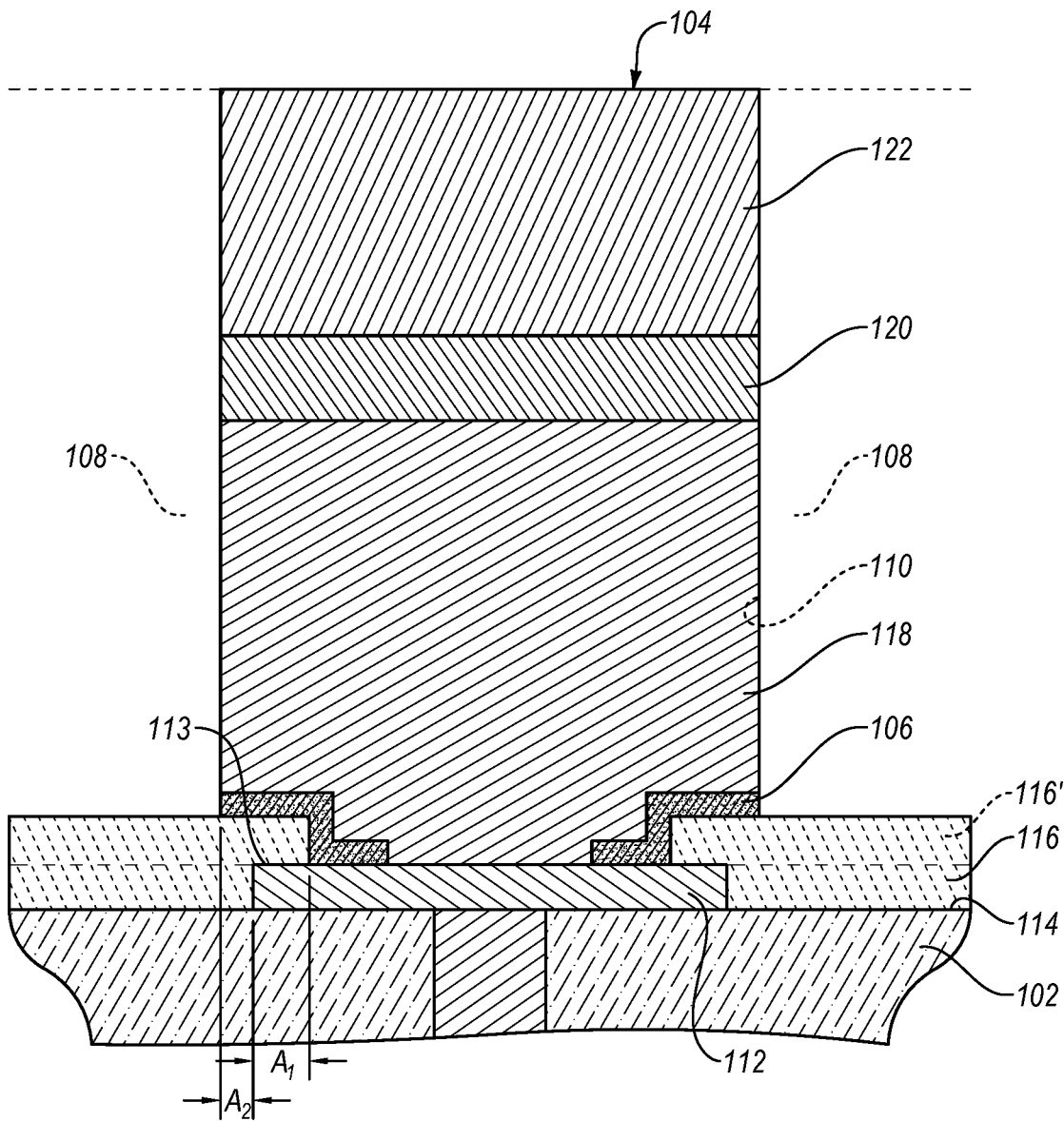

Referring now to FIGS. 1 and 2 of the drawings, an embodiment of a method for fabricating a 3D structure for a semiconductor die, and the resulting structure, are described.

In FIG. 1, a semiconductor die 102 comprises a bond pad 112 on active surface 114 surrounded by a passivation material 116, and a repassivation material 116' if a separate such material is employed. Bond pad 112 may comprise a copper or an aluminum material and passivation material 116 may comprise, for example, at least one of $SiN_x$, $SiO_x$ and $SiO_xN_y$. In one embodiment, passivation material 116 and/or repassivation material 116' may comprise $SiO_2$ and $Si_3N_4$, applied by a chemical vapor deposition (CVD) technique. Repassivation material 116' may also comprise, for example, a polymer material such as a polyimide material. Passivation material 116 or repassivation material 116' may extend over a lateral periphery 113 of bond pad 112 a distance, for example about 5 to 7 µm, leaving a substantial portion of the bond pad 112 exposed for formation of an electrically conductive element or 3D structure 104 (see FIG. 2).

In FIG. 2, 3D structures in the form of electrically conductive elements (hereinafter referred to simply as "3D structures 104" for simplicity) may be formed by sequentially blanket depositing a seed material 106, of, for example, tungsten, titanium, titanium/tungsten or tantalum, (for example, by physical vapor deposition PVD) over passivation material 116 and copper or aluminum bond pad 112, selectively masking the seed material 106 with a positive or negative tone photoresist 108 (shown in broken lines) applied to a thickness, for example about 44 µm and patterned to leave aperture 110 exposing seed material 106 over bond pad 112 and over a first selected area $A_1$ over passivation material 116 covering a peripheral portion of bond pad 112 and a second selected area $A_2$ peripheral to bond pad 112, and forming pillars of copper material 118 on exposed seed material 106 by electroplating. Notably, seed material 106 may be selectively masked and etched prior to application of photoresist 108 so that seed material 106 remains only at locations (for example, over bond pad 112 and surrounding passivation material 116) where 3D structures 104 are to be formed. Alternatively, seed material 106 may remain over an entirety of passivation material 116 on active surface 114 for formation of 3D structures thereon, and removed later. As formed, 3D structure 104 comprising a pillar of copper material 118 is configured for diffusion bonding with a terminal pad of another component initiated by a thermocompression bonding process. Optionally, nickel material 120, and solder material 122 (e.g., SnAg) or other electroplatable material (e.g., Sn, SnCu) may be formed on copper material 118 if heat-induced mass reflow is to be employed for connecting to another component. Pillars of copper material 118 may have, for example, a diameter of about 30 µm lateral extent (e.g., diameter) with about 15 µm, of copper material 118 in contact with the material of bond pad 112, with another about 15 µm in contact with seed material 106 over passivation material 116. Electroplated nickel material 120 may, in some embodiments, be employed as a barrier layer to prevent formational of intermetallic compounds between copper material 118 and the solder material 122. Nickel material 120 may comprise a thickness, for example, of about 3 µm. Electroplated solder material 122 may comprise a thickness, for example, of about 15 µm. All material thicknesses for a conductive element 104 are approximate as the electroplated copper material 118, nickel material 120 and solder material 122 may, in practice, exhibit nonlinear (e.g., arcuate) boundaries between adjacent materials. After the electroplating processes are completed, photoresist 108 and the seed material 106 are then removed from active surface 114.

Referring to FIGS. 3A through 3E, a first embodiment of a method according to the disclosure will be described. FIG. 3A is a schematic side sectional elevation of a portion of an assembly 100 comprising a semiconductor die 102 having a bond pad 112 on an active surface 114. 3D structures 104 in the form of, for example, pillars of copper material 118, optionally capped with nickel material 120 and solder material 122, are formed as described above with respect to FIGS. 1 and 2. 3D structure 104r at the left hand side of FIG. 3A is formed on and adhered to bond pad 112 and to an adjacent portion of passivation material referenced at 116 for simplicity by a seed material 106 deposited, masked and selectively etched to leave seed material 106 only at locations for formation of 3D structures thereon, as described with respect to FIGS. 1 and 2. However, 3D structure 104r at the right hand side of FIG. 3A is formed on and adhered only to passivation material 116 through seed material 106, resulting in a substantially weaker bond, particularly susceptible to shear stress.

As shown in FIG. 3B, a photodefinable material 130 exhibiting dielectric (i.e., electrically insulative) properties and comprising, by way of non-limiting example, a positive tone photodefinable material such as a photodefinable polyimide, is nonselectively applied over passivation material 116 on active surface 114, to a thickness of about 2 µm to about 10 µm, also covering 3D structures 104l and 104r to a second, lesser thickness (not shown) of, for example, about 1 µm or less. Spin coating may be used to apply flowable photodefinable material 130 over active surface 114, as the combination of centrifugal and gravitational forces may be used to reduce the thickness photodefinable material 130 over conductive elements 104 as desired. Spray coating of a flowable photodefinable material 130 may also be employed. The use of a relatively viscous photodefinable material 130 enables thinning over 3D structures 104 while ensuring a sufficient thickness of photodefinable material 130 over active surface 114. The photodefinable material 130 may be deposited by a so-called "direct write" process similar to that employed in ink jet printing. The photodefinable material 130 may also be applied as a dry film using vacuum lamination, which technique also facilitates thinning of photodefinable material 130 over 3D structures 104. Suitable dielectric materials for use in photodefinable materials include, for example, polyimides, epoxies, polybenzoxazole (PBO), and bezocyclobutene (BCB). Photodefinable material vendors include, by way of example only, JSR Micro, Inc., Sunnyvale, Calif., Sumitomo Bakelite Co., Ltd., Tokyo, Japan, HD Microsystems, Parlin, N.J., and Shin-EtsuMicroSi, Phoenix, Ariz. One suitable photodefinable material is MA1001, offered by Asahi Kasei Corporation, Tokyo, Japan.

In FIG. 3C, after application of photodefinable material 130 to passivation material 116 over active surface 114 and over 3D structures 104*l* and 104*r*, a portion of the photodefinable material 130 extending over active surface 114 and over the left hand 3D structure 104*l* is exposed to a selected dose of broadband radiant energy $R_D$, for example a mercury arc light source. The selected dose magnitude comprise a power magnitude of, for example, $E_0$, a radiant energy dose $R_D$ required to substantially completely remove a thickness of photodefinable material 130 from over active surface 114 by rendering it soluble in a developer. In terms of relative required power, the dose $R_D$ applied to penetrate, for example, a polyimide-based photodefinable material 130 of about 5 µm thickness may comprise an energy of about 150 mJ, whereas $E_0$=500 mJ. The broadband radiant energy may comprise G-H-I ultraviolet broadband exposure at wavelength peaks of 436, 405 and 365 nm, respectively. Employing a selected dose of broadband radiant energy $R_S$ of $E_0$ results in penetration of an entirety of the thickness of photodefinable material 130 rendering the penetrated portion soluble in and therefore removable by, a developer.

Further, and also as depicted in FIG. 3C, the abovementioned mercury arc light source, may be used to produce a sub dose of radiant energy $R_{SD}$ with a partially optically transmissive photomask 132, commonly characterized as a "grey-tone reticle" or a "leaky chrome" mask in the art, to expose photodefinable material 130 over and adjacent to right hand 3D structure 104*r* to a reduced dose of radiant energy $R_{SD}$. Chrome is conventionally employed as a mask material to block transmission of light, and a leaky chrome mask comprises a checkerboard pattern of chrome or other mask material and open areas at extremely small resolution, for example, less than 1 µm, such as 0.5 µm or even 0.25 µm resolution. The coverage of semiconductor die 102 with a partially optically transmissive photomask 132 can be used to reduce the full dose of radiant energy $R_D$ to a suitable sub dose $R_{SD}$ by limiting radiant energy transmission using characteristic of the photomask to effect the desired energy reduction. Employing a selected sub dose of broadband radiant energy $R_{SD}$ less than $E_0$ results in penetration of only part of the thickness of photodefinable material 130, rendering only the penetrated portion soluble in and therefore removable by, a developer. Notably, if a dry film of photodefinable material 130 is applied, photomask 132 may be, if necessary, configured to provide a full dose of radiant energy $R_D$ to the top of 3D structure 104*r* in order to expose and remove a full thickness of the film, while an annulus-shaped leaky chrome segment is aligned with and extends around the 3D structure 104*r*.

As shown in FIG. 3D, after exposure to the radiant energy, positive photodefinable material 130 is developed. Photodefinable material 130 over passivation material 116 over active surface 114 and over and about the side of left hand 3D structure 104*l*, having been substantially completely penetrated by radiant energy dose $R_D$ and exposed, is then removed. However, due to the reduced magnitude of radiant energy $R_{SD}$ in proximity to right hand 3D structure 104*r*, the full thickness of photodefinable material 130 over active surface 114 and surrounding right hand 3D structure 104*r* has not been penetrated and exposed. As a result, when the exposed part of the thickness of photodefinable material 130 is developed and dissolved, an unexposed thickness 130*u* remains over active surface 114, surrounding and in contact with 3D structure 104*r*.

As shown in FIG. 3E, after photodefinable material 130 has been developed, it is cured with an elevated temperature cure, adheres to passivation material 116 and to 3D structure 104, and forms a substantially solid support element in the form of collar 134 about 3D structure 104*r*. Collar 134 may act as a shear stress buffer, reducing the potential for mechanical damage during handling and assembly and avoiding the potential for electrical or other reliability issues. The shape of cured photodefinable material 130, shown as substantially frustoconical in FIG. 3E, may be adjusted by selective alteration of cure temperature and temperature ramp-up within thermal budget limits. A fast temperature ramp in curing may preserve more of the initial shape of the photodefinable material 130, while a slow temperature ramp up may allow the photodefinable material to slump during cure, resulting in a shape like that shown in FIG. 4E. Interaction between photodefinable material 130 and the developer employed may also affect the final shape of collar 134. Notably, photodefinable polyimides exhibit substantial adherence to polyimide passivation materials as well as passivation materials of $SiN_x$, $SiO_x$ and $SiO_xN_y$, such adherence being chemistry-dependent. Consequently, photodefinable materials 130 other than polyimides and as noted above may be employed with other passivation materials to maximize mutual adherence. In addition, photodefinable materials as employed in embodiments of the disclosure are compatible with capillary underfill (CUF) materials, non-conductive paste (NCP) materials and non-conductive film (NCF) materials employed in the bond lines of multi-component semiconductor device assemblies.

Figure 4B:
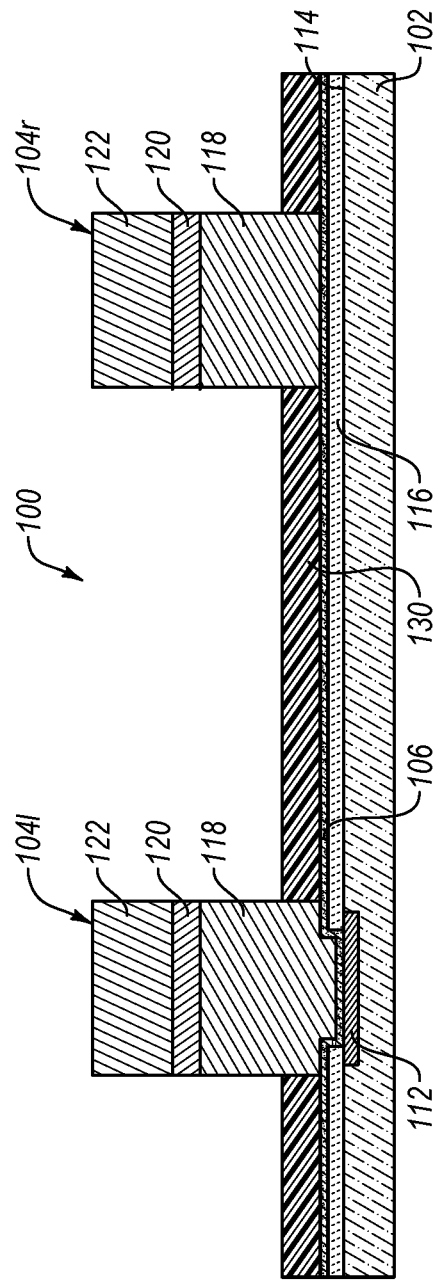

Referring to FIGS. 4A through 4E, another embodiment of a method according to the disclosure will be described. FIG. 4A is a schematic side sectional elevation of a portion of an assembly 100 comprising a semiconductor die 102 having a bond pad 112 on an active surface 114. 3D structures 104*l* and 104*r* in the form of pillars of copper material 118, optionally capped with nickel material 120 and solder material 122, are formed as substantially as described above with respect to FIGS. 1 and 2 in the variant wherein blanket deposited seed material 106 on passivation material 116 is not selectively masked and etched before application and patterning of photoresist 108. 3D structure 104*l* at the left hand side of FIG. 3A is adhered to bond pad 112 and to a passivation material referenced at 116 for simplicity over active surface 114 by a seed material 106 deposited as described with respect to FIGS. 1 and 2. However, 3D structure 104*r* at the right hand side of FIG. 3A is only adhered through seed material 106 to passivation material 116, resulting in a substantially weaker bond, particularly susceptible to shear stress.

As shown in FIG. 4B, a photodefinable material 130 exhibiting dielectric (i.e., electrically insulative) properties and comprising, by way of non-limiting example, a positive tone photodefinable material such as a photodefinable polyimide, is nonselectively applied over passivation material 116 on active surface 114, pools to a thickness of about 2 µm to about 10 µm on active surface 114, and also covers tops and sides of 3D structures 104*l* and 104*r* to a second, lesser thickness (not shown) of, for example, about 1 µm or less.

Spin coating may be used to apply flowable photodefinable material 130 over active surface 114, as the combination of centrifugal and gravitational forces may be used to reduce the thickness photodefinable material 130 over 3D structures 104 as desired. Spray coating of a flowable photodefinable material 130 may also be employed. The use of a relatively viscous photodefinable material 130 enables thinning over 3D structures 104 while ensuring a sufficient thickness of photodefinable material 130 over active surface 114. The photodefinable material 130 may be deposited by a so-called "direct write" process similar to that employed in in jet printing. The photodefinable material 130 may also be applied as a dry film using vacuum lamination, which technique also facilitates thinning of photodefinable material 130 over 3D structures 104. Suitable dielectric materials for use in photodefinable materials include, for example, polyimides, epoxies, polybenzoxazole (PBO), and bezocyclobutene (BCB). Photodefinable material vendors include, by way of example only, JSR Micro, Inc., Sunnyvale, Calif., Sumitomo Bakelite Co., Ltd., Tokyo, Japan, HD Microsystems, Parlin, N.J., and Shin-Etsu MicroSi, Phoenix, Ariz. Suitable photodefinable materials include, for example, MA1001 offered by Asahi Kasei Corporation, Tokyo, Japan.

Figure 4C:
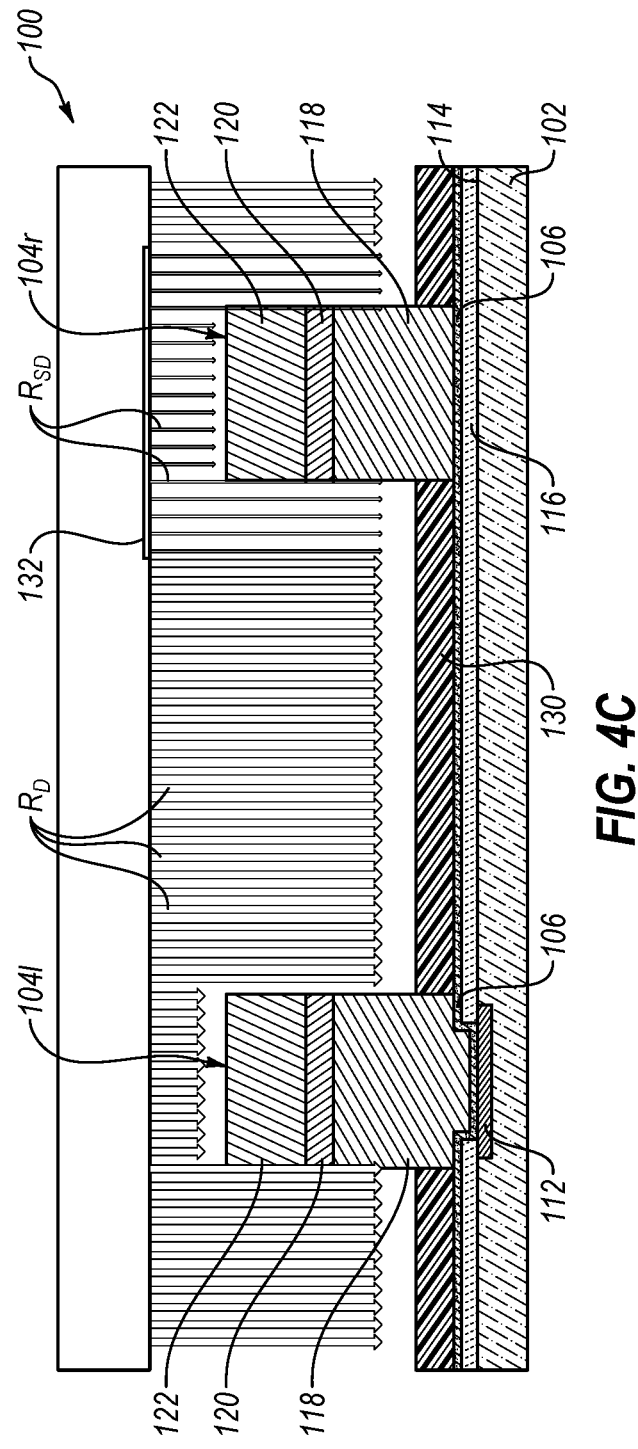

In FIG. 4C, after application of photodefinable material 130 to passivation material 116 over active surface 114 and over 3D structures 104l and 104r, a portion of the photodefinable material 130 extending over active surface 114 and over the left hand 3D structure 104r is exposed to a selected dose of broadband radiant energy $R_D$, for example a mercury arc light source. The selected dose magnitude comprise a power magnitude of, for example, $E_0$, a radiant energy dose required to substantially completely remove the thickness of photodefinable material 130 from over active surface 114 by rendering it soluble in a developer. In terms of relative required power, the dose $R_D$ applied to penetrate, for example, a polyimide-based photodefinable material 130 of about 5 µm thickness may comprise an energy of about 150 mJ, whereas $E_0$=500 mJ. The broadband radiant energy may comprise G-H-I ultraviolet broadband exposure at wavelength peaks of 436, 405 and 365 nm, respectively. Employing a selected dose of broadband radiant energy $R_S$ of $E_0$ results in penetration of an entirety of the thickness of photodefinable material 130 rendering the penetrated portion soluble in and therefore removable by, a developer.

Further, and also as depicted in FIG. 4C, the abovementioned mercury arc light source, may be used to produce a sub dose of radiant energy $R_{SD}$ with a partially optically transmissive photomask 132, commonly characterized as a "grey-tone reticle" or a "leaky chrome" mask in the art, to expose photodefinable material 130 over and adjacent to right hand 3D structure 104r to a reduced dose of radiant energy $R_{SD}$. Chrome is conventionally employed as a mask material to block transmission of light, and a leaky chrome mask comprises a checkerboard pattern of chrome or other mask material and open areas at extremely small resolution, for example, less than 1 µm, such as 0.5 µm or even 0.25 µm resolution. The coverage of semiconductor die 102 with a partially optically transmissive photomask 132 can be used to reduce the full dose of radiant energy $R_D$ to a suitable sub dose $R_{SD}$ by limiting radiant energy transmission using characteristics of the photomask to effect the desired energy reduction. Employing a selected sub dose of broadband radiant energy $R_{SD}$ less than $E_0$ results in penetration of only part of the thickness of photodefinable material 130, rendering only the penetrated portion soluble in and therefore removable by, a developer. Notably, if a dry film of photodefinable material 130 is applied, photomask 132 may be configured to provide a full dose of radiant energy $R_D$ to the top of 3D structure 104r in order to expose and remove a full thickness of the film, while an annulus-shaped leaky chrome segment is aligned with and extends around the 3D structure 104r.

As shown in FIG. 4D, after exposure to the radiant energy, positive photodefinable material 130 is developed. Photodefinable material 130 over passivation material over active surface 114 and over and about the side of left hand 3D structure 104l, having been substantially completely penetrated by radiant energy dose $R_D$ and exposed, is then removed. However, due to the reduced magnitude of radiant energy $R_{SD}$ in proximity to right hand 3D structure 104r, the full thickness of photodefinable material 130 over active surface 114 and surrounding right hand 3D structure 104 has not been penetrated and exposed. As a result, when the exposed part of the thickness of photodefinable material 130 is developed and dissolved, an unexposed thickness remains over active surface 114, surrounding and in contact with 3D structure 104r.

As shown in FIG. 4E, after photodefinable material 130 has been developed, it is cured with an elevated temperature cure, adheres to underlying passivation material 116, to seed material 106 on passivation material 116 adjacent 3D structure 104r, and to 3D structure 104, and forms a substantially solid collar 134 about 3D structure 104r. Collar 134 may act as a shear stress buffer, reducing the potential for mechanical damage during handling and assembly and avoiding the potential for electrical or other reliability issues. The shape of cured photodefinable material 130, shown as substantially frustoconical in FIG. 4E, may be adjusted by selective alteration of cure temperature and temperature ramp-up within thermal budget limits. A fast temperature ramp in curing may preserve more of the initial shape of the photodefinable material 130, while a slow temperature ramp up may allow the photodefinable material to slump during cure, resulting in a shape like that shown in FIG. 4E. Interaction between photodefinable material 130 and the developer employed may also affect the final shape of collar 134. Notably, photodefinable polyimides exhibit substantial adherence to polyimide passivation materials, for example if repassivation material 118 (FIG. 2) is a polyimide and to passivation materials of $SiN_x$, $SiO_x$ and $SiO_xN_y$, such adherence being chemistry-dependent. Consequently, photodefinable materials 130 other than polyimides and as noted above may be employed with other passivation materials to maximize mutual adherence. In addition, photodefinable materials as employed in embodiments of the disclosure are compatible with capillary underfill (CUF) materials, non-conductive paste (NCP) materials and non-conductive film (NCF) materials employed in the bond lines of multi-component semiconductor device assemblies.

Also as shown in FIG. 4E, after photodefinable material 130 has been cured, seed material 106 over passivation material 116 and between 3D structures 104 is removed by a conventional technique such as a wet acid etch or a plasma etch, preventing electrical shorting between 3D structures 104.

Photodefinable material comprising, for example, a photodefinable polyimide has been described herein to be a so-called "positive" tone material which, when exposed to radiant energy of one or more suitable wavelengths and then developed, may be removed. However, the inventors herein contemplate that the techniques described herein may also be implemented using a "negative" tone photodefinable material in conjunction with a skeleton mask to cover the tops of pillar-type 3D structures on a semiconductor substrate surface as well as surface areas remote from the 3D structures during exposure of a wafer comprising photodefinable material-coated semiconductor dice to radiant energy, such exposure being followed by developing using a positive developer. In such a situation, the unexposed photodefinable material covering the tops of the conductive elements and the remote surface areas is removed, leaving the exposed, developed photodefinable material peripherally surrounding the 3D structures and abutting the sides of the 3D structures to be cured and form collars thereabout.

While application of photodefinable material has been described herein primarily with reference to a blanket deposition process, as noted above a direct-write process may be employed for deposition. In such an instance, in order to conserve photodefinable material and reduce process time, photodefinable material may be selectively deposited in one or more write passes only adjacent to and around 3D structures to a desired thickness and lateral distance, and then exposed to radiant energy at a subdose $R_{SD}$ for partial penetration of the photodefinable material using a grey-tone reticle to reduce transmitted radiant energy, or a radiant light source at a reduced power magnitude. If deposition accuracy is such that the photodefinable material may be precisely placed to desired widths and thicknesses, it is contemplated that radiant energy exposure may be eliminated, and the photodefinable material merely cured. Alternatively, a negative tone photodefinable material may be employed in the direct-write process, and the semiconductor dice bearing 3D structures surrounded by photodefinable material exposed to a desired radiant energy without using a mask, and then cured.

While 3D structures according to embodiments of the disclosure are described herein with reference to being formed of copper by electroplating, the disclosure is not so limited and other metal materials and other deposition techniques may be employed without departing from the scope of the disclosure.

It is contemplated for selected applications of embodiments of the disclosure that the methods described herein may be employed to enhance adhesion of pillar-on-pad 3D structures to substrate surfaces, in addition to enhancing adhesion of such structures to, for example, passivation materials on such surfaces. In other words 3D structures such as 3D structures 104*l* in the drawing figures may have collars 134 formed thereabout if adhesion and shear strength of such 3D structures is sought to be enhanced. Such collars are shown in broken lines in FIGS. 3E and 4E.

3D structures 104 have been depicted as pillars or columns, and described as circular in shape, but configurations thereof are not so limited. For example, 3D structures of rectangular or polygonal cross-section may benefit from enhanced adhesion and shear stress resistance. It is contemplated that 3D structures exhibiting an aspect ratio (height-to-width ratio) of about 1.5 to 1 or greater may benefit from implementation of embodiments of the disclosure in that regard.

Figure 5:
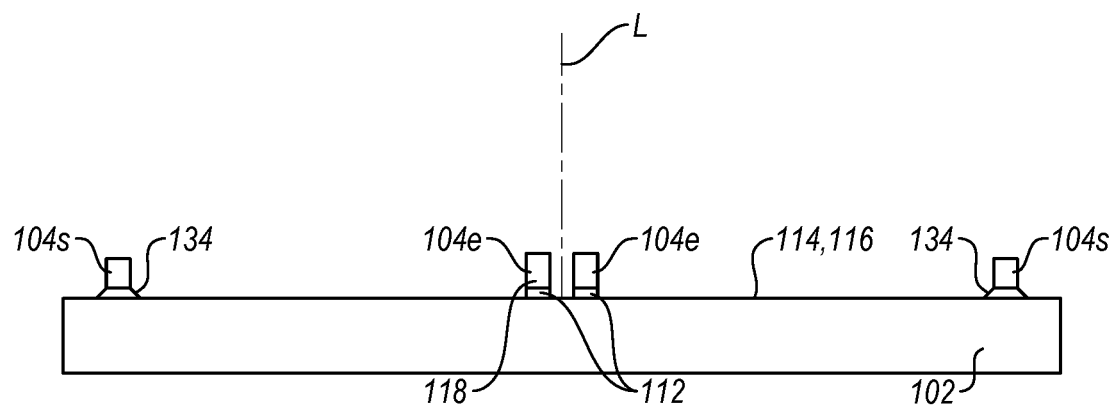
FIG. 5 is a schematic side elevation of a semiconductor die including 3D structures with associated support elements according to an embodiment of the disclosure.

FIG. 5 schematically depicts a side elevation of a semiconductor die 102 configured as a DRAM die and having two rows of bond pads 112 on active surface 114 adjacent to and on opposing sides of a longitudinal axis L of the die, the bond pads 112 having 3D structures 104*e* thereon in the form of pillars of copper material 118 for electrical connections to another component. In FIG. 5, the pillars are configured for diffusion bonding, and so are not capped with solder. As described above, copper material 118 is formed by electroplating on a seed material 106, which may be in contact with exposed surfaces of bond pads 112 as well as peripherally surrounding portions of passivation material 116 over active surface 114. Additional 3D structures 104*s* are located proximate edges of active surface 114 of semiconductor die 102, formed concurrently with the 3D structures on bond pads 112 but on seed material 106 on passivation material 116 according to embodiments. 3D structures 104*s* having collars 134 and proximate edges of active surface 114 are electrically isolated and be characterized as standoffs or outriggers acting as stabilizing elements for disposition of semiconductor die 102 on another electronic component, such as another die, an interposer, or a circuit board. 3D structures 104*s* include collars 134 as described above, which may improve adhesion to active surface 114.

Figure 6:
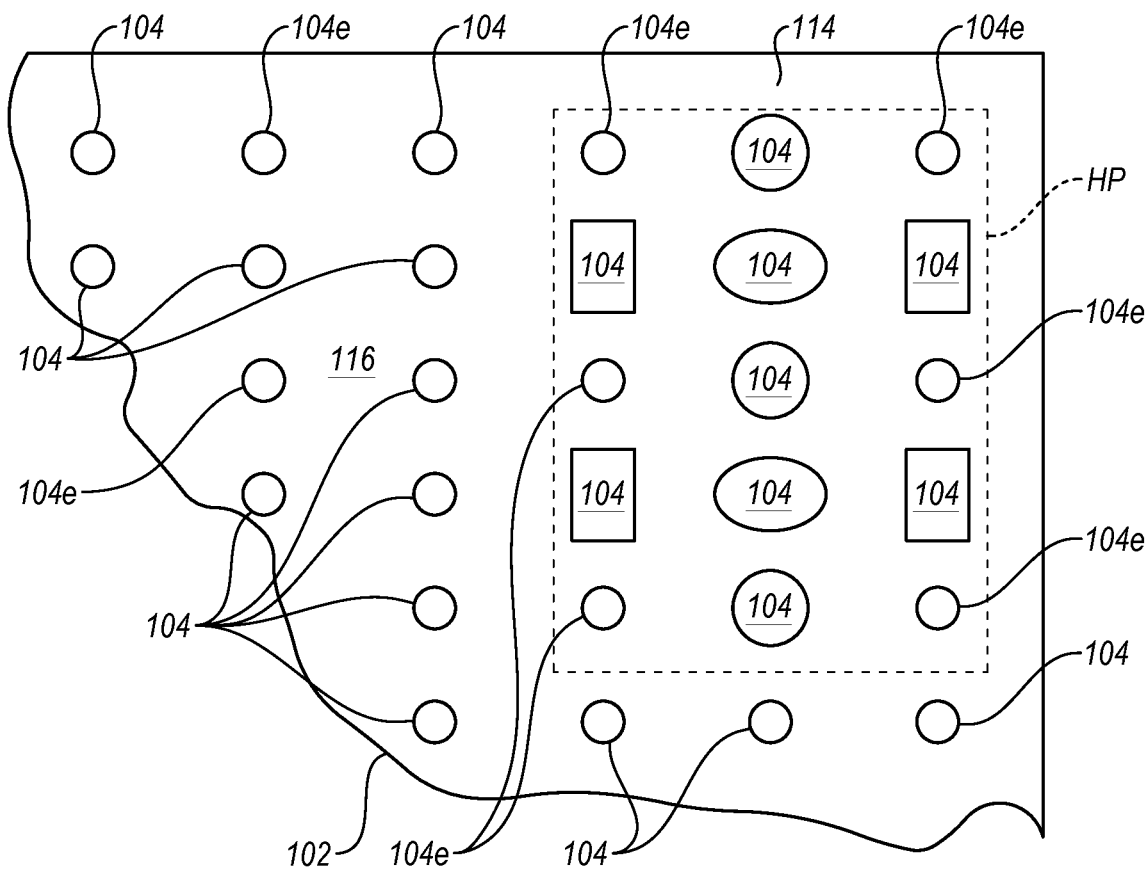
FIG. 6 is a schematic top elevation of a semiconductor die including 3D structures with associated support elements according to an embodiment of the disclosure.

FIG. 6 is a top elevation of a semiconductor die 102 configured, for example, as a logic die having 3D structures 104*e* comprising pillars on an active surface thereof for electrical communication of underlying integrated circuitry (not shown) with one or more other electronic components. Additionally, 3D structures 104 are located on active surface 114, 3D structures 104 being electrically isolated from the underlying integrated circuitry by a passivation material 116, some of 3D structures 104 being located at regular intervals over the active surface 114, interspersed with 3D structures 104*e*. 3D structures 104 provide enhanced heat transfer from semiconductor die 102. Certain 3D structures 104 may be located and concentrated within a relatively higher power area HP of active surface 114 of semiconductor die 102. Area HP generates a substantially larger amount of heat than other areas of semiconductor die 102, requiring as shown, larger 3D structures and 3D structures of different shapes, for example, cylindrical, rectangular and elliptical, placed for increased heat transfer from area HP. Some or all of 3D structures 104 may have a support structure, such as a collar 134 (see FIGS. 3E and 4E), abutting at least a portion of a periphery thereof and adhered thereto as well as to passivation material 116.

Figure 7:
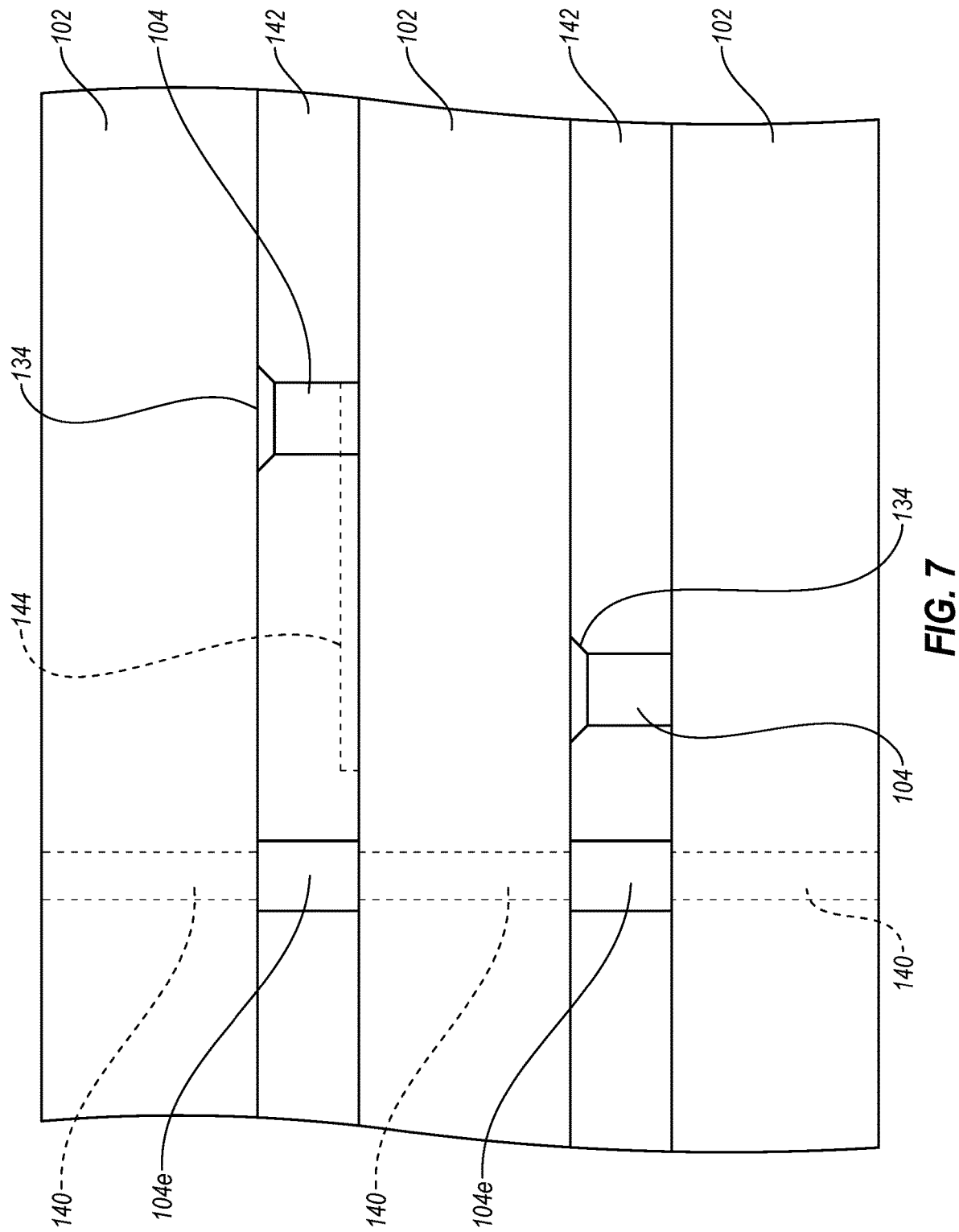
FIG. 7 is a schematic side elevation of a portion of an electronic assembly including stacked semiconductor dice die including 3D structures with associated support elements according to an embodiment of the disclosure.

FIG. 7 is a side schematic elevation of an assembly of stacked semiconductor dice 102 have conductive vias 140, commonly called "through silicon vias," or "TSVs" therethrough, the conductive vias 140 connected by aligned 3D structures 104*e* in the bond line 142 between the dice for power, ground (bias) and signal transmission among the dice of the stack. Also located in the bond line are 3D structures 104 which are electrically isolated from at least one of the dice with which they are in contact, to provide at least one of support between the dice in the bond line, stability between the dice, or enhanced heat transfer between mutually adjacent semiconductor dice 102 of the stack. As shown, 3D structures 104 may vertically aligned, or be laterally offset from one another on different bond lines 142, and heat transfer between the offset 3D structures may be enhanced using traces 144, one of which is shown in broken lines. At least some 3D structures 104 may have support structures in the form of collars 134 associated therewith, abutting at least a portion of a periphery thereof and adhered thereto as well as to a major surface of a semiconductor die 102.

Figure 8A:
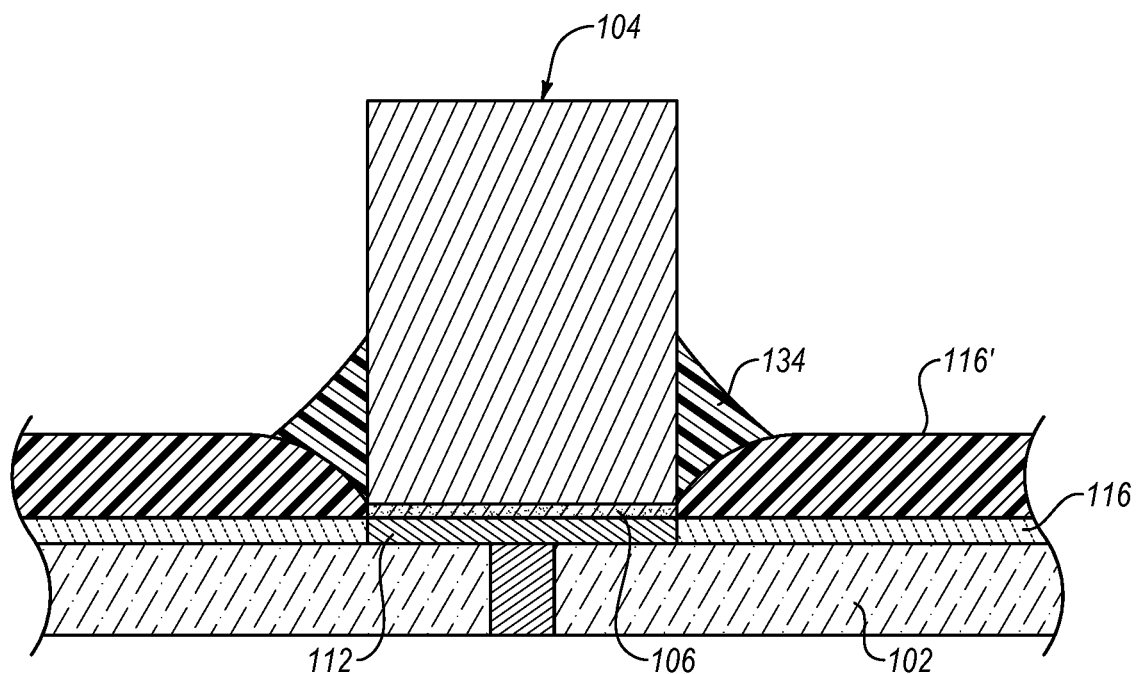
FIGS. 8A and 8B are, respectively, schematic side sectional elevations of 3D structures with associated support elements according to embodiments of the disclosure.
Figure 8B:
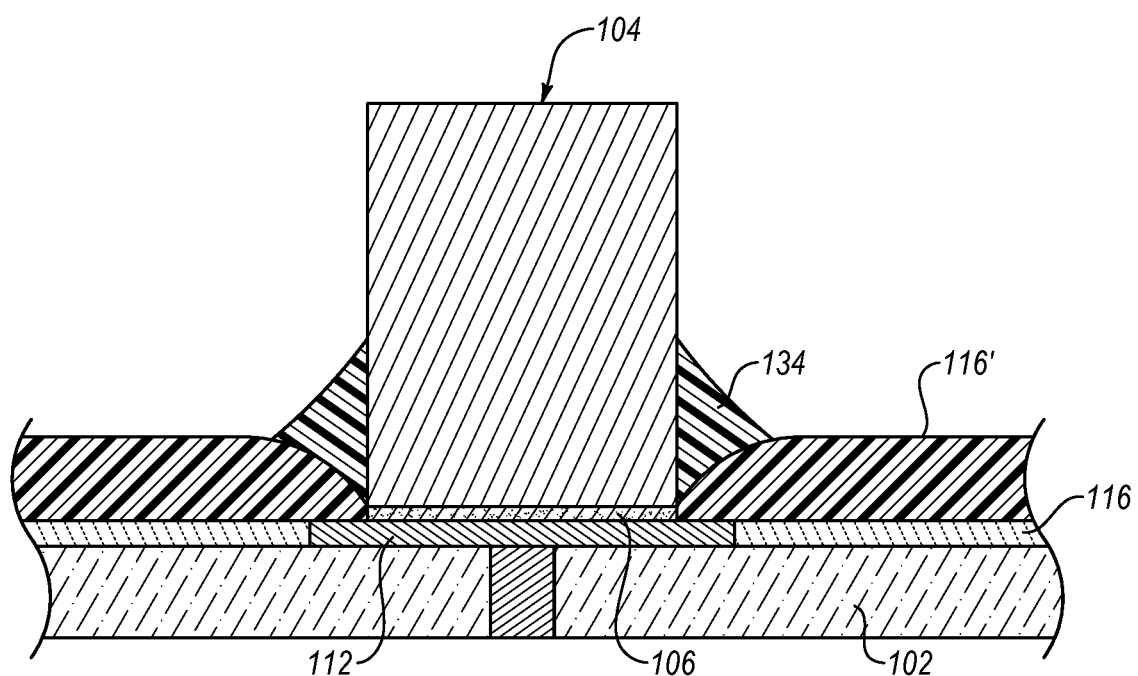

FIG. 8A and FIG. 8B depict, respectively, two additional embodiments of the disclosure. FIG. 8A depicts a semiconductor die 102 having a bond pad 112 surrounded by, for example a glass passivation material 116 and having a 3D structure 104 comprising a pillar of copper material 118 secured to bond pad 112 through a seed material 106. 3D structure 104 extends over substantially an entire surface of bond pad 112, and a repassivation material 116' comprising a polyimide material substantial abuts a periphery of 3D structure 104 about a periphery of bond pad 112. A cured, photodefinable polyimide extends over and adheres to repassivation material 116' and forms a support in the form of collar 134 about, in contact with and adhering to side wall of 3D structure 104. FIG. 8B depicts a semiconductor die 102 having a bond pad 112 surrounded by, for example, a glass passivation material 116 and having a 3D structure 104 comprising a pillar of copper material 118 secured to bond pad 112 through a seed material 106. 3D structure 104 extends over a portion of surface of bond pad 112, and a repassivation material 116' comprising, a polyimide material extends over an outer periphery of bond pad 112 and substantial abuts a periphery of 3D structure 104. A cured, photodefinable polyimide extends over and adheres to repassivation material 116' and forms a support 134 about, in contact with and adhering to side wall of 3D structure 104.

Figure 9:
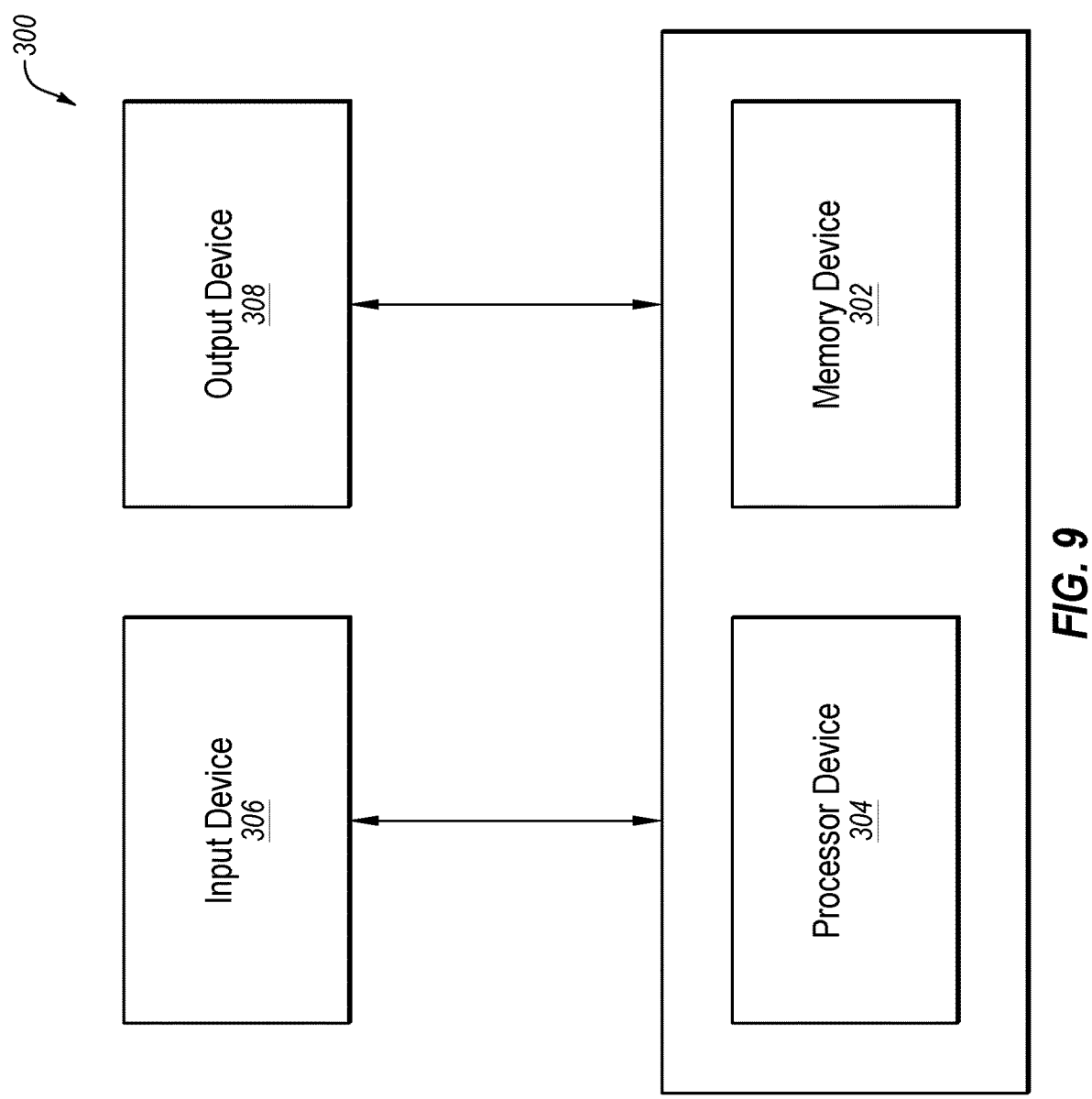
FIG. 9 is a block diagram of an electronic system including at least one semiconductor die including 3D structures with associated support elements according to one or more embodiments of the disclosure.

Semiconductor devices (e.g., one or more semiconductor dice 102) in accordance with embodiments of the disclosure may be used in embodiments of electronic systems of the disclosure. For example, FIG. 9 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 300 includes at least one memory device 302. The memory device 302 may include, for example, an embodiment of a semiconductor die 102 or an assembly of multiple dice as described herein. Such memory device may, optionally, include dice configured for other functions such as, for example, a logic die, an RF die, or both. The electronic system 300 may further include at least one electronic signal processor device 304 (often referred to as a "microprocessor"). The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304. It is also contemplated that, in lieu of separate memory and signal processor devices 302 and 304, a single assembly of semiconductor dice having different functionalities may be configured as a system in a package including a processor and/or other die functionalities as noted previously.

It is contemplated that die assemblies incorporating 3D structures with enhanced support and adhesion characteristics according to embodiments of the disclosure and as are described herein in comparison to die assemblies employing 3D structures as illustrated at the right hand side of each of FIGS. 3A and 4A, yields of functional semiconductor dice assemblies after reliability stress testing of two-high or greater, for example up to 32-high or greater, die stacks using a Highly Accelerated Stress Test (HAST) and Temperature Cycle (TMCL) test will be measurably increased. For example, shear strength for 3D structures may be at least doubled, or even increased up to five to ten times that of unsupported 3D structures, resulting in such significantly greater yields.

As will be readily appreciated by those of ordinary skill in the art, methods according to the disclosure may be employed in semiconductor packaging without increasing bond line thickness, without changing in package dimensions or 3D structure designs, to promote higher 3D structure adhesion and structural strength for more robust structures, and provide better reliability and performance due to toughness of the cured, photodefinable collar materials at the pillar-to-substrate surface interfaces. In addition, when a capillary underfill (CUF) material is employed at the bond lines, the rounded edges of the collars may enhance flow performance, and provide a polymer-to-polymer interfacial compatibility between the collars and the CUF material, reducing the potential for any voids in the bond line.

While the disclosure is susceptible to various modifications and alternative forms, specific embodiments have been shown by way of example in the drawings and have been described in detail herein. However, the disclosure is limited to the particular forms disclosed. Rather, the disclosure encompasses all modifications, equivalents, and alternatives falling within the scope of the disclosure as defined by the following appended claims and their legal equivalents.

What is claimed is:

1. A method of enhancing adhesion of a 3D structure to a substrate, the method comprising:
    applying a photodefinable material to a surface of a substrate and surrounding a periphery of at least one 3D structure protruding from the surface thereof;
    exposing the photodefinable material abutting the at least one 3D structure to a sub dose of radiant energy less than a dose of radiant energy sufficient to penetrate substantially an entire thickness of the photodefinable material;
    while exposing the photodefinable material abutting the at least one 3D structure to the sub dose of radiant energy, exposing at least one other portion of the photodefinable material laterally spaced from the at least one 3D structure and surrounding the photodefinable material abutting the 3D structure to the dose of radiant energy;
    removing the at least one other portion of the photodefinable material that was exposed to the dose of radiant energy; and
    allowing the photodefinable material abutting the 3D structure to change shape.

2. The method of claim 1, wherein: exposing the at least one other portion of the photodefinable material to the dose of radiant energy comprises rendering the at least one other portion of the photodefinable material soluble in a developer;
    removing the at least one other portion of the photodefinable material comprises dissolving the at least one other portion of the photodefinable material in a developer; and
    exposing the photodefinable material abutting the at least one 3D structure to the sub dose of radiant energy comprises rendering only a partial thickness of the photodefinable material soluble in the developer, and further comprising removing only the partial thickness thereof by dissolving in the developer to leave a remaining portion of the photodefinable material.

3. The method of claim 2, further comprising curing the remaining portion of the photodefinable material abutting the at least one 3D structure to a substantially solid state to form a support structure about at least a portion of a periphery of the 3D structure.

4. The method of claim 3, wherein curing the remaining portion of the photodefinable material further comprises adhering the support structure to the at least one 3D structure and to the surface of the substrate under the support structure.

5. The method of claim 3, wherein applying a photodefinable material to a surface of a substrate comprises applying the photodefinable material to a passivation material over the surface.

6. The method of claim 5, wherein applying a photodefinable material to the surface of a substrate further comprises applying the photodefinable material to a seed material in addition to the passivation material.

7. The method of claim 6, further comprising removing exposed seed material after curing the remaining portion of the photodefinable material abutting the at least one 3D structure.

8. The method of claim 1, wherein exposing the photodefinable material abutting the at least one 3D structure to a sub dose of radiant energy comprising producing the sub dose of radiant energy by reducing transmission of the dose of radiant energy from a light source using a partially transmissive photomask.

9. The method of claim 1, further comprising selecting the photodefinable material to include a dielectric material selected from the group consisting of polyimides, epoxies, polybenzoxazole, and bezocyclobutene.

10. The method of claim 1, wherein applying the photodefinable material is effected by one of a spin coating, a spray coating, a direct-write or a dry film vacuum lamination technique.

11. The method of claim 1, wherein allowing the photodefinable material abutting the at least one 3D structure to change shape comprises allowing the photodefinable material abutting the at least one 3D structure to slump into a substantially frustoconical shape surrounding the 3D structure.

12. A method of enhancing adhesion of a 3D structure to a substrate, the method comprising:
    applying a positive tone photodefinable material to only a surface of a substrate abutting a periphery of at least one 3D structure protruding from the surface; and
    curing the positive tone photodefinable material to a substantially solid state to form a support.

13. The method of claim 12, further comprising allowing the positive tone photodefinable material to slump before the positive tone photodefinable material enters the substantially solid state.

14. A method of enhancing adhesion of a 3D structure to a substrate, the method comprising:
    applying a negative tone photodefinable material to only a surface of a substrate abutting a periphery of at least one 3D structure protruding from the surface;
    exposing the negative tone photodefinable material to radiant energy; and
    curing the negative tone photodefinable material to a substantially solid state to form a support.

15. The method of claim 14, further comprising allowing the negative tone photodefinable material to slump before the negative tone photodefinable material enters the substantially solid state.

16. A method of enhancing adhesion of a 3D structure to a substrate, the method comprising:
    applying a photodefinable material to a surface of a substrate, a portion of the photodefinable material surrounding and abutting a periphery of at least one 3D structure protruding from the surface;
    exposing the portion of the photodefinable material surrounding and abutting the at least one 3D structure to a dose of radiant energy sufficient to penetrate substantially an entire thickness of the photodefinable material;
    while exposing the portion of the photodefinable material surrounding and abutting the at least one 3D structure to the dose of radiant energy, preventing exposure of the photodefinable material over a top of the at least one 3D structure and at least one other portion of the photodefinable material laterally spaced from the at least one 3D structure and surrounding the photodefinable material surrounding and abutting the at least one 3D structure to the dose of radiant energy;
    removing the at least one other portion of the photodefinable material that was prevented from exposure to the dose of radiant energy; and
    allowing the photodefinable material abutting the at least one 3D structure to change shape.

17. The method of claim 16, wherein exposing the portion of the photodefinable material surrounding and abutting the at least one 3D structure to the dose of radiant energy comprises rendering the photodefinable material surrounding and abutting the at least one 3D structure insoluble in a developer; and
    removing the at least one other portion of the photodefinable material that was prevented from exposure to the dose of radiant energy comprises dissolving the at least one other portion of the photodefinable material in a developer.

18. The method of claim 16, further comprising curing the portion of the photodefinable material surrounding and abutting the at least one 3D structure to a substantially solid state to form a support about the 3D structure.

19. The method of claim 16, wherein allowing the photodefinable material abutting the at least one 3D structure to change shape comprises allowing the photodefinable material abutting the at least one 3D structure to slump into a substantially frustoconical shape surrounding the at least one 3D structure.

* * * * *

UNITED STATES PATENT AND TRADEMARK OFFICE
CERTIFICATE OF CORRECTION

PATENT NO. : 10,790,251 B2  
APPLICATION NO. : 16/013237  
DATED : September 29, 2020  
INVENTOR(S) : Christopher J. Gambee et al.

Page 1 of 1

It is certified that error appears in the above-identified patent and that said Letters Patent is hereby corrected as shown below:

In the Specification

| | | |
|---|---|---|
| Column 4, | Line 3, | change "the terra "photodefinable" to --the term "photodefinable-- |
| Column 11, | Line 43, | change "In other words" to --In other words,-- |
| Column 13, | Line 9, | change "116' comprising, a" to --116' comprising a-- |

Signed and Sealed this  
Fifth Day of January, 2021

Andrei Iancu  
*Director of the United States Patent and Trademark Office*